United States Patent
Davis et al.

(10) Patent No.: US 7,682,709 B1
(45) Date of Patent: Mar. 23, 2010

(54) GERMANIUM DOPED N-TYPE ALUMINUM NITRIDE EPITAXIAL LAYERS

(75) Inventors: Robert F. Davis, Raleigh, NC (US); Cheng Wang, San Jose, CA (US)

(73) Assignee: North Carolina State University, Raleigh, NC (US)

( * ) Notice: Subject to any disclaimer, the term of this patent is extended or adjusted under 35 U.S.C. 154(b) by 0 days.

(21) Appl. No.: 08/550,195

(22) Filed: Oct. 30, 1995

(51) Int. Cl.
*B32B 18/00* (2006.01)

(52) U.S. Cl. ........................ 428/698; 428/700

(58) Field of Classification Search .............. 428/698, 428/700; 257/596, 595
See application file for complete search history.

(56) References Cited

U.S. PATENT DOCUMENTS

| | | | |
|---|---|---|---|
| 2,997,446 A | 8/1961 | Adams et al. | 252/301.4 R |
| 3,922,475 A * | 11/1975 | Manaseirt | 428/700 |
| 4,153,905 A * | 5/1979 | Charmakadze | 257/30 |
| 4,509,451 A | 4/1985 | Collins et al. | 118/50.1 |
| 4,946,735 A | 8/1990 | Lee et al. | 428/220 |
| 5,210,051 A | 5/1993 | Carter, Jr. | 437/107 |

OTHER PUBLICATIONS

*Si- and Ge-Doped GaN Films Grown with GaN Buffer Layers*, Nakamura et al., Jpn.J.Appl.Phys., vol. 31 (1992) pp. 2883-2888.

\* cited by examiner

*Primary Examiner*—Timothy M. Speer
(74) *Attorney, Agent, or Firm*—Philip Summa

(57) ABSTRACT

A method of preparing an n-type epitaxial layer of aluminum nitride conductively doped with germanium comprises directing a molecular beam of aluminum atoms onto the growth surface of a substrate that provides an acceptable lattice match for aluminum nitride; directing a molecular beam of activated nitrogen to the growth surface of the substrate; and directing a molecular beam of germanium to the growth surface of the substrate; while maintaining the growth surface of the substrate at a temperature high enough to provide the surface mobility and sticking coefficient required for epitaxial growth, but lower than the temperature at which the surface would decompose or the epitaxial layer disassociate back into atomic or molecular species.

9 Claims, 1 Drawing Sheet

GERMANIUM DOPED N-TYPE ALUMINUM NITRIDE EPITAXIAL LAYERS

This invention was made with Government support under Grant Nos. N00014-92-J-1720 and N00014-92-J-1477 awarded by the Office of Naval Research. The Government has certain rights in the invention.

FIELD OF THE INVENTION

The present invention relates to wide bandgap semiconductor materials and devices formed therefrom, and in particular relates to a method of forming an n-type aluminum nitride epitaxial layer doped with germanium and resulting device structures.

BACKGROUND OF THE INVENTION

Aluminum nitride (AlN) has been recognized for many years as a semiconductor material with a sufficiently wide bandgap to attract attention as a suitable material for electronic devices, including photonic ("optoelectronic") devices such as light emitting diodes (LEDs). As used herein, the term light emitting diode refers to a semiconductor device which emits visible light (i.e. the portion of the electromagnetic spectrum visible to the human eye) when a potential difference is applied, and a resulting electric current passes across a p-n junction in the device.

Aluminum nitride is of particular interest because of its extremely wide bandgap of about 6.32 electron volts (eV). Generally speaking, a semiconductor's bandgap represents the largest energy transition that can be produced by a junction device using that semiconductor. In turn, because of the well known relationship E=hu between the energy of a transition and the light that can be potentially emitted from it, semiconductor materials with wider bandgaps can produce higher energy transitions which in turn can produce light of higher frequency ($\upsilon$) and shorter wavelength ($\lambda$).

When expressed in terms of visible light, for example, blue light is considered (somewhat arbitrarily) to fall within the wavelength range of 455 to 492 nanometers (nm) and thus requires a transition of between 3.67 eV and 3.97 eV. Many semiconductor materials have bandgaps that are generally smaller than this threshold, and thus cannot be used under any circumstance to produce blue light. In turn, because blue is one of the three primary colors (along with red and green), the difficulty in obtaining blue light from semiconductor LEDs translates into an accompanying difficulty of producing full color LED displays or LED white light sources, each of which require some contribution of blue light.

Aluminum nitride is also attractive for LEDs because it is a direct bandgap semiconductor; i.e. its radiative recombination process requires no phonon (vibrational energy) to conserve energy. Thus, AlN is expected to produce light more efficiently than do the indirect bandgap materials that produce phonons as well as photons in their transitions.

Blue light emitting diodes (including lasers and ultraviolet diodes and lasers), are not, however, the only attractive product that can be formed by wide bandgap materials. Wide bandgap materials such as aluminum nitride also tend to exhibit better physical and electronic stability at high temperatures, making them suitable for all sorts of electronic applications that occur at high temperature or under other such thermally stressed conditions.

Wide bandgap materials are also attractive for "power" electronic applications in which devices are required to amplify current and to otherwise handle high voltages and large currents. As known to those of ordinary skill in the art, as power increases across a junction, temperature resultingly increases as well until at a given temperature for a given material the diode characteristics will cease. Wide bandgap materials such as AlN accordingly offer advantages in such power devices.

Additionally, wider bandgap materials are radiation "hard", meaning that they can better withstand the effects of bombardment with electromagnetic energy. This makes such materials attractive for military and other applications under which such bombardment would be expected.

Because most semiconductor devices, including LEDs, are p-n junction devices, however, obtaining p-type and n-type epitaxial layers of the material represents one of the necessary fundamental steps in the development of semiconductor materials into viable devices.

Aluminum nitride is a difficult material to work with. To date, the published reports of shallow (i.e. near the bandedge) level n and p-type doping of aluminum nitride have been vague and somewhat contradictory. Most of the interest in Group III nitride semiconductors has focused on various ternary and quaternary compounds such as aluminum gallium nitride (AlGaN), indium gallium nitride (InGaN), and indium aluminum gallium nitride (InAlGaN). The Group III nitrides are difficult to form into coherent bulk single crystals appropriate for substrates for semiconductor devices. Thus, the requirement that other materials (such as sapphire) serve as substrates for such devices has to some extent limited their development.

Furthermore, a functionally conductive layer requires an appropriate dopant. In previous work, silicon was used as a known dopant for gallium nitride but not for aluminum nitride. Silicon has been demonstrated to work as an n-type dopant for gallium nitride but has not performed appropriately as an n-type dopant for aluminum nitride in attempts to date. Doping of aluminum nitride has been particularly difficult to accomplish using the metal organic chemical vapor deposition technique ("MOCVD" or just "CVD"). Although the exact cause of such difficulty is unknown, and the inventors do not wish to be bound by any particular theory supporting the failure of others, CVD techniques generally use compound sources rather than elemental ones. For example, a typical aluminum CVD source is trimethylaluminum ("TMA," $(CH_3)_3Al$); a typical nitrogen source is ammonia ($NH_3$), and a typical germanium source is germane ($GeH_4$). As a result, it appears that CVD techniques consistently tend to leave some amount of hydrogen ($H_2$) in epitaxially grown films, and that the resulting hydrogen in the crystalline layer may interfere with the n-type doping in aluminum nitride. It has already been established that hydrogen affects p-type doping in gallium nitride, but interestingly enough hydrogen doesn't appear to affect silicon doping at all.

As another possibility, aluminum nitride has a tendency to scavenge oxygen ($O_2$), which can likewise prevent successful doping. Such scavenging is more likely to occur in a CVD system and thus interfere with the overall doping process.

OBJECT AND SUMMARY OF THE INVENTION

Therefore, it is an object of the present invention to provide a method for successfully doping aluminum nitride with an n-type dopant that will produce effective n-type epitaxial layers.

The invention meets this object with an n-type epitaxial layer of aluminum nitride conductively doped with germanium.

In another aspect the invention comprises a device precursor structure comprising a silicon carbide substrate and an n-type epitaxial layer of aluminum nitride conductively doped with germanium on the silicon carbide substrate.

In yet another aspect the invention comprises a rectifying diode comprising a silicon carbide substrate; an n-type epitaxial layer of aluminum nitride conductively doped with germanium on the silicon carbide substrate; and a p-type epitaxial layer of a group III nitride on the n-type aluminum nitride epitaxial layer, in which the p-type layer and the n-type layer form a rectifying p-n junction.

In a further aspect the invention comprises a method of preparing an n-type epitaxial layer of aluminum nitride conductively doped with germanium, and a method of preparing an n-type epitaxial layer of gallium nitride conductively doped with germanium.

The foregoing and other objects, advantages and features of the invention, and the manner in which the same are accomplished, will become more readily apparent upon consideration of the following detailed description of the invention taken in conjunction with the accompanying drawings, which illustrate preferred and exemplary embodiments, and wherein:

DETAILED DESCRIPTION

Figure 1:
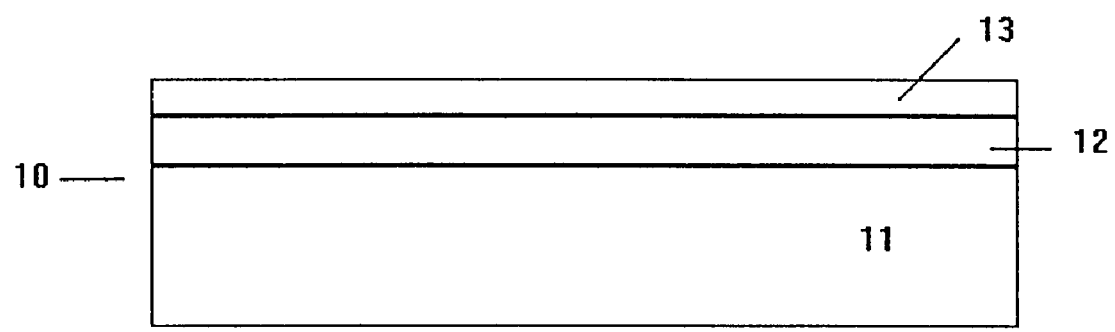
FIG. 1 is a cross-sectional view of a rectifying diode that incorporates an aluminum nitride layer according to the present invention.

The invention is an n-type epitaxial layer of aluminum nitride conductively doped with germanium. Because the invention provides such an n-type epitaxial layer of aluminum nitride, it can be incorporated with a substrate to form a device precursor, and in conjunction with both a substrate and another epitaxial layer, can comprise a rectifying diode.

FIG. 1 illustrates such a rectifying diode broadly designated at 10 in which the substrate is designated at 11, the n-type aluminum nitride epitaxial layer according to the invention is indicated at 12, and a p-type layer of an appropriate semiconductor material is illustrated at 13.

A preferred material for the substrate 11 comprises silicon carbide which is most preferably selected from the 4H and 6H polytypes of silicon carbide because they currently offer the best crystal lattice match with aluminum nitride, and thus with the aluminum nitride layer 12. Presently, the 6H polytype of silicon carbide is more widely available than the 4H poly type, and thus represents the most preferred embodiment at this time.

For a number of reasons, including electronic and physical compatibility, the p-type epitaxial layer 13 is preferably formed of a Group III nitride and forms a rectifying p-n junction between the p-type layer 13 and the n-type layer of aluminum nitride. The p-type layer can comprise gallium nitride, or one of the ternary aluminum gallium nitride compounds indicated by the formula $Al_xGa_{1-x}N$ wherein 1 is greater than x, and x is greater than 0 (1>x>0).

When an ohmic contact is applied to a germanium doped aluminum nitride film according to the present invention (preferably aluminum annealed at 400° C.) the layer demonstrates conductivity. The resistivity of such a layer was measured at both room temperature (25° C.) and 85K. At room temperature the resistivity is 1.3e-5 ohm-centimeters ($\Omega$cm), and at 85K was 1.6e-5 $\Omega$cm. The Hall mobility was 180.8 at room temperature and 704.8 at 85K. The effective carrier concentration was 2.6e21 at room temperature and 5.7e20 at 85K.

As used herein, the "e" designation is an exponential abbreviation; e.g. 1.3e-5 means $1.3\times10^{-5}$.

The invention further comprises a method of making both a germanium doped aluminum nitride film and a germanium doped gallium nitride film, again with annealed (400° C.) aluminum as contact materials. For a gallium nitride layer formed according to the method of the invention, the resistivity at room temperature was 7.2e-5 $\Omega$cm, and at 85K was 1.3e-5 $\Omega$cm. The Hall mobility was 150.6 at room temperature and 472.5 at 85K. The carrier concentration was 5.9e20 at room temperature and 1.1e20 at 85K. The measured gallium nitride layer was deposited at 650° C. with a Ge/Ga flux ratio of 2e-4. The annealed aluminum contact to the doped GaN layer appeared to exhibit better ohmic behavior than did the annealed aluminum contact to the AlN layer described above.

The invention further comprises a method of preparing an epitaxial layer of aluminum nitride, and a method of preparing and n-type layer of gallium nitride, each conductively doped with germanium. In forming the n-type epitaxial layer of aluminum nitride conductively doped with germanium, the method comprises directing a molecular beam of aluminum atoms onto the growth surface of a substrate that provides an acceptable lattice match for aluminum nitride; directing a molecular beam of activated nitrogen to the growth surface of the substrate; and directing a molecular beam of germanium to the growth surface of the substrate; while maintaining the growth surface of the substrate at a temperature high enough to provide the surface mobility and sticking coefficient required for epitaxial growth, but lower than the temperature at which the surface would decompose or the epitaxial layer disassociate back into atomic or molecular species.

As used herein, the phrase "molecular beam" is taken from the designation "molecular beam epitaxy" and can represent beams of atoms as well as molecules. Molecular beam epitaxy (MBE) generally incorporates a system that includes a chamber in which an ultra-high vacuum (e.g. on the order of about $10^{-11}$ Torr) is maintained. The elements to be deposited on the substrate in crystalline form are kept adjacent the deposition chamber in heated containers that are generally referred to Knudsen cells. The cells are shuttered to provide a system for opening and closing them. When the cell shutters are opened, the elemental molecules or atoms exit and because of the ultra-high vacuum are limited to travel in substantially one direction towards a sample or substrate by a combination of the ultra-high vacuum and cryogenic shrouds. The shrouds capture stray atoms and the ultra-high vacuum extends the mean free path of the molecules or atoms, greatly decreasing their tendency to collide or otherwise deviate from a straight line path between the Knudsen cell and the sample.

The basic layout of an MBE system is fundamentally well understood and specific details of the operation of particular systems for the purpose of carrying out the method of the invention are either well known to those familiar with the technique or can be developed without undue experimentation. Typical details are set forth, for example, in E. H. C. Parker (Ed.), *The Technology and Physics of Molecular Beam Epitaxy,* 1985, Plenum Press, New York, N.Y. In addition to the chamber, the system usually includes an ultra-high vacuum (UHV) pump, a diffusion pump, a cryopump, or a turbomolecular pump. As noted above, the cryogenic shrouds surround the Knudsen cells so that when the shutter to a Knudsen cell is opened, the shroud captures atoms or molecules exiting the cell and that are moving other than in the one general direction towards the substrate.

At the sample surface, epitaxial growth of the desired compound takes place as the molecules or atoms impinge upon the growth surface.

One of the main advantages of MBE is its ability to carry out epitaxial growth at relatively low temperatures, particularly compared to alternative methods such as chemical vapor deposition.

As used herein, the term "sticking coefficient" refers to the ratio of atoms striking the growth surface to the number of atoms that actually remain to form a crystalline structure on that growth surface.

In the present invention, the step of directing the molecular beam of aluminum atoms comprises directing a beam of aluminum from a condensed source that is maintained at about 1100° C. As used herein, the word "condensed" refers to solids, liquids, or some other combination phase other than the gas phase.

The silicon carbide substrate is preferably maintained at a temperature of between about 650° C. and 1100° C., and most preferably about 900° C.

Similarly, the step of directing the molecular beam of germanium comprises directing the germanium from a condensed source that is maintained at about 990° C. In a preferred embodiment, the Ge/Al flux ratio is maintained at about 1e-4.

The step of directing the molecular beam of activated nitrogen comprises directing the beam from a plasma source. The phrase "activated nitrogen" is used herein to describe the nitrogen produced by such a plasma source. Although the exact form of nitrogen produced by the plasma source is not presently known, the Applicants herein believe that it represents a molecular nitrogen ion ($N_2^+$) rather than disassociated atoms of nitrogen and other elements such as hydrogen (e.g. if ammonia $NH_3$ were used as the plasma's nitrogen source.)

The invention further comprises the method of making a gallium nitride layer conductivity doped with germanium. The method is essentially the same as the method of producing aluminum nitride conductively doped with germanium except that Applicants believe that the present invention is the first example of such a doped layer of gallium nitride being produced from a condensed elemental source of germanium (preferably at a cell temperature of about 990° C.) rather than a gaseous source. As noted otherwise herein, these condensed sources offer a number of process advantages, particularly because of the purity offered by the condensed sources as opposed to the compound sources that are required for chemical vapor deposition.

In the drawings and specification, there have been disclosed typical preferred embodiments of the invention and, although specific terms have been employed, they have been used in a generic and descriptive sense only and not for purposes of limitation, the scope of the invention being set forth in the following claims.

That which is claimed is:

1. A conductive n-type epitaxial layer of aluminum nitride on a substrate, and wherein said epitaxial layer is doped with germanium as the n-type dopant.

2. An aluminum nitride epitaxial layer according to claim 1 wherein the carrier concentration of germanium is $2.6 \times 10^{21}$.

3. A device precursor structure comprising a silicon carbide substrate and an n-type epitaxial layer of aluminum nitride conductively doped with germanium on said silicon carbide substrate.

4. A device precursor according to claim 3 wherein said substrate is selected from the group consisting of the 4H and 6H polytypes of silicon carbide.

5. A rectifying diode comprising:
   a silicon carbide substrate;
   a conductive n-type epitaxial layer of aluminum nitride doped with germanium as the n-type dopant on said silicon carbide substrate; and
   a p-type epitaxial layer of a group III nitride on said conductive n-type aluminum nitride epitaxial layer, said p-type layer and said n-type layer forming a rectifying p-n junction therebetween.

6. A rectifying diode according to claim 5 wherein said substrate is selected from the group consisting of the 4H and 6H polytypes of silicon carbide.

7. A rectifying diode according to claim 5 wherein said p-type epitaxial layer comprises aluminum nitride.

8. A rectifying diode according to claim 5 wherein said p-type epitaxial layer comprises gallium nitride.

9. A rectifying diode according to claim 5 wherein said p-type epitaxial layer comprises a Group III nitride having the formula $Al_xGa_{1-x}N$ wherein $1>x>0$.

* * * * *